United States Patent
Petrucelli

(10) Patent No.: US 9,746,524 B2
(45) Date of Patent: Aug. 29, 2017

(54) SYSTEM AND METHOD FOR MONITORING BATTERY STATUS

(71) Applicant: Measurement Ltd., Grand Cayman (KY)

(72) Inventor: Steven Petrucelli, Cranbury, NJ (US)

(73) Assignee: Measurement Ltd., Grand Cayman (KY)

( * ) Notice: Subject to any disclaimer, the term of this patent is extended or adjusted under 35 U.S.C. 154(b) by 213 days.

(21) Appl. No.: 14/530,012

(22) Filed: Oct. 31, 2014

(65) Prior Publication Data

US 2016/0077159 A1   Mar. 17, 2016

Related U.S. Application Data

(60) Provisional application No. 62/049,728, filed on Sep. 12, 2014, provisional application No. 62/053,513, filed on Sep. 22, 2014.

(51) Int. Cl.
| | |
|---|---|
| *G01N 27/416* | (2006.01) |
| *G01R 31/36* | (2006.01) |
| *G01K 13/00* | (2006.01) |
| *H01M 10/48* | (2006.01) |

(52) U.S. Cl.
CPC ........... *G01R 31/362* (2013.01); *G01K 13/00* (2013.01); *G01R 31/36* (2013.01); *G01R 31/3689* (2013.01); *H01M 10/48* (2013.01); *H01M 10/486* (2013.01)

(58) Field of Classification Search
CPC .. G01R 31/36; G01R 31/362; G01R 31/3689; H01M 10/48; H01M 10/486
USPC ............................................ 324/426
See application file for complete search history.

(56) References Cited

U.S. PATENT DOCUMENTS

| | | | |
|---|---|---|---|
| 6,820,205 B2 | 11/2004 | Odaohhara et al. | |
| 8,131,486 B2 | 3/2012 | Leonard et al. | |
| 2003/0054229 A1* | 3/2003 | Odaohhara | G01R 31/3648 429/61 |
| 2005/0038614 A1* | 2/2005 | Botts | G01R 31/3606 702/63 |
| 2010/0019718 A1 | 1/2010 | Salasoo et al. | |
| 2010/0114512 A1 | 5/2010 | Cotton et al. | |

(Continued)

OTHER PUBLICATIONS

Gordon-Bloomfield, Nikki. "How Long Will Your Electric Car Battery Last? It Depends Where You Live". http://www.greencarreports.com/news/1077329_how-long-will-your-electric-car-battery-last-it-depends-where-you-live. Jun. 28, 2012.

(Continued)

*Primary Examiner* — Nathaniel Pelton
(74) *Attorney, Agent, or Firm* — Howard IP Law Group, P.C.

(57) ABSTRACT

A system for monitoring battery status and estimating battery life including a battery monitor configured to connect to a battery. The battery monitor comprises a voltage detection circuit, a temperature sensor and a wireless transmitter configured to transmit voltage and temperature data measured by the voltage detection circuit and the temperature sensor. The system further includes a remote device operative to receive battery voltage and temperature data from the battery monitor, generate a real-time indication of battery voltage, and generate predicted battery life data.

14 Claims, 16 Drawing Sheets

(56) References Cited

U.S. PATENT DOCUMENTS

| | | | | |
|---|---|---|---|---|
| 2012/0007556 A1* | 1/2012 | Matsui | ............... | G01R 31/3651 |
| | | | | 320/112 |
| 2012/0130660 A1* | 5/2012 | Neumeyer | ......... | G01R 31/3679 |
| | | | | 702/63 |
| 2012/0316810 A1* | 12/2012 | Syed | ..................... | H01M 10/42 |
| | | | | 702/63 |

OTHER PUBLICATIONS

"Parasitic Draw and Short Battery Life" http://www.agcoauto.com/content/news/p2_articleid/211. Available at least as of Aug. 2, 2014.
"Battery Check" Product Description page. https://teambmpro.com/au/shop/battery-check.html#. Available at least Aug. 2, 2014.
International Search Report dated Dec. 29, 2015 for related application PCT/US15/49274.
Written Opinion of the International Searching Authority dated Dec. 29, 2015 for related application PCT/US15/49274.

\* cited by examiner

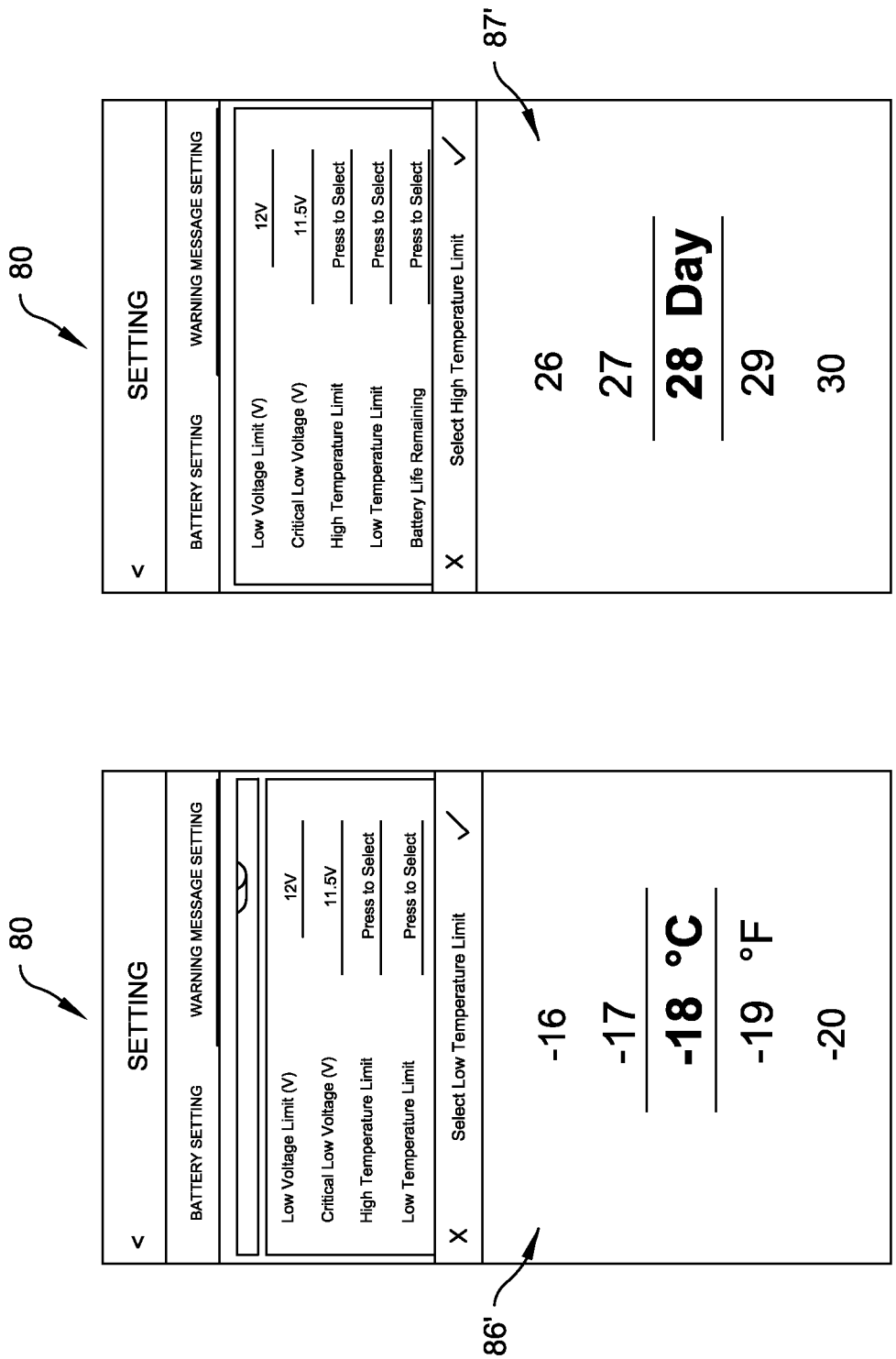

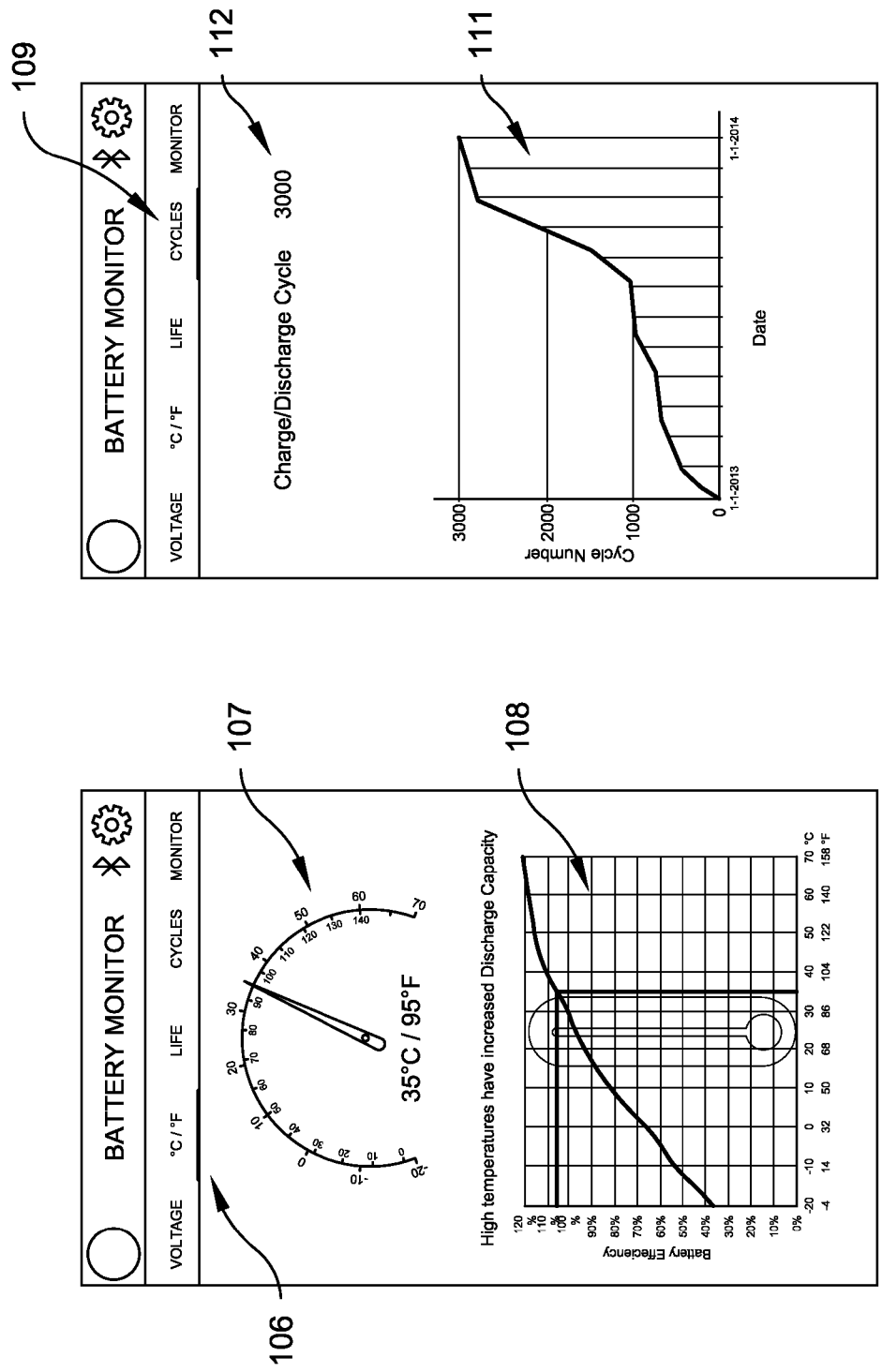

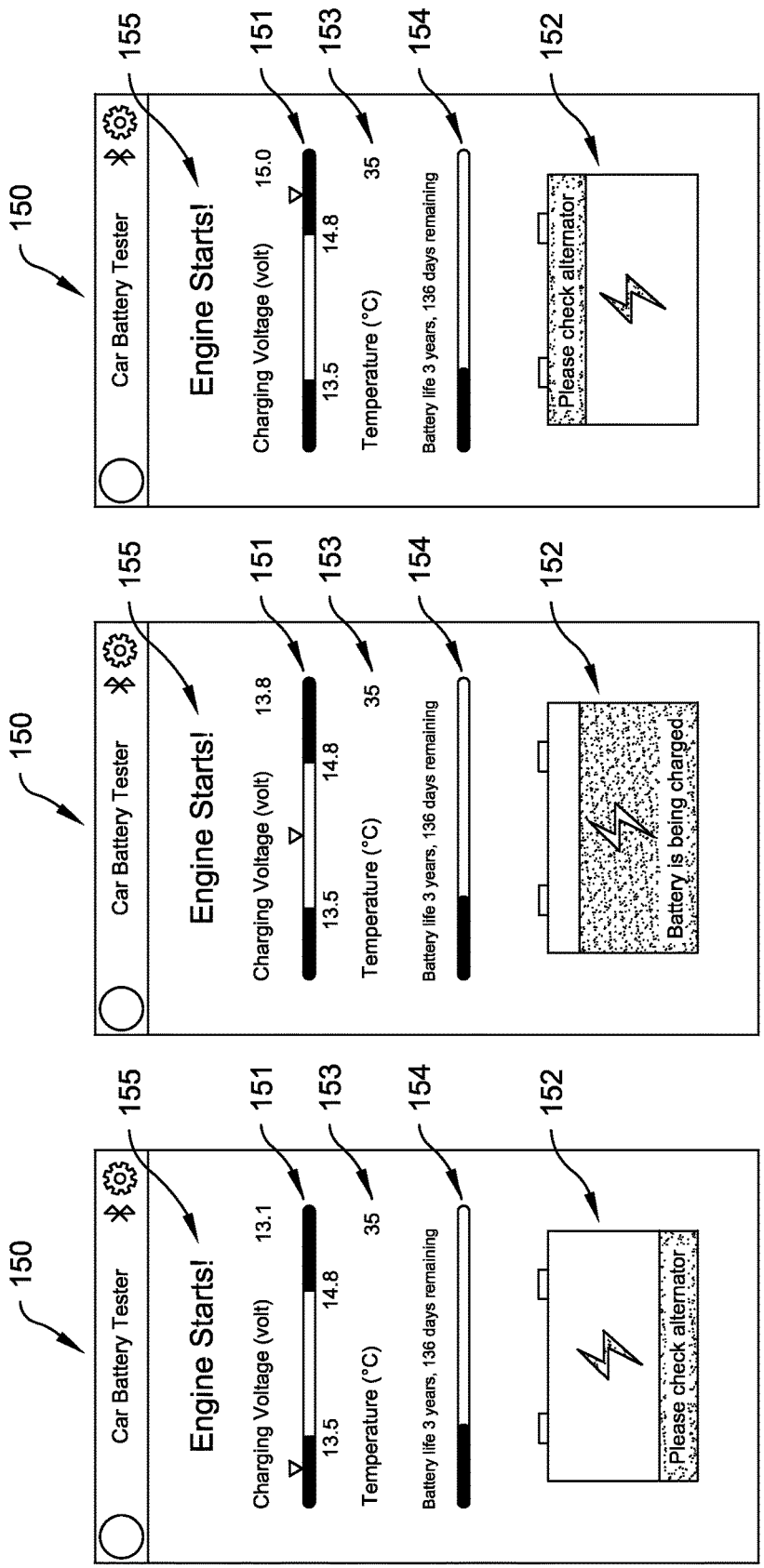

SYSTEM AND METHOD FOR MONITORING BATTERY STATUS

CROSS-REFERENCE TO RELATED APPLICATIONS

This application claims priority to, and benefit under 35 U.S.C. §119(e) of, U.S. Provisional Application No. 62/049,728 entitled "Battery Tester", filed on Sep. 12, 2014, and U.S. Provisional Application No. 62/053,513 also entitled "Battery Tester", filed on Sep. 22, 2014, the entire disclosures of which are hereby incorporated by reference for all purposes as if being set forth in their entirety herein.

FIELD OF THE INVENTION

The present disclosure relates to power supply monitoring systems. More particularly, it relates to systems and methods for remotely monitoring the status and estimating a useful life of a power supply, such as a battery.

BACKGROUND OF THE INVENTION

Power supplies, such as batteries, are critical to the function of countless devices. For example, in many applications battery performance may be vital for ensuring the health and safety of an individual. These applications may include healthcare equipment (CPAP machines, ventilators, infusion pumps, etc.) either operating primarily from battery power, or which rely on auxiliary battery power in the event of a primary power source failure. Other wide-spread applications of battery power include the automotive and transportation industries, wherein the operation of vehicles and other equipment may be dependent on battery power (e.g. for performing starting operations).

In order to ensure the reliable performance of batteries in these and all battery applications, it is important not only to be able to monitor a current status of a battery (e.g. voltage level), but also to be able to predict future battery life. Battery life is a factor of many different characteristics, in addition to the power drawn by a load associated with battery. For example, environmental conditions have significant affects on life of a battery. As humidity is reduced, batteries can dry out reducing battery life. Likewise, as humidity increases, batteries may take on moisture, interfering with the natural discharge expansion, resulting in swelling/leakage and reducing battery life. Moreover, as temperature is reduced, battery voltage is lowered and reaches a functional end point earlier, reducing battery life. Further still, as altitude increases, the percentage of oxygen level in the air is reduced, lowering the battery voltage thereby reducing battery life.

Accordingly, improved systems and methods for accurately and conveniently monitoring battery status (e.g. battery voltage) and predicting future battery service life are desired.

SUMMARY

In one embodiment of the present disclosure, a system for monitoring battery status and estimating battery life is provided. The system includes a battery monitor configured to connect to a battery. The battery monitor comprises a voltage detection circuit, a temperature sensor and a wireless transmitter configured to transmit voltage and temperature data measured by the voltage detection circuit and the temperature sensor. The system further includes a remote device comprising one or more computer processors and a memory in communication with the one or more processors and storing program instructions. The one or more computer processors are operative with the program instructions to: 1) receive battery voltage and temperature data from the battery monitor; 2) generate a real-time indication of battery voltage; and 3) using the received battery voltage and temperature data, generate predicted battery life data.

In another embodiment of the present disclosure, a method for monitoring the status of a battery and estimating the life of the battery is provided. The method includes the steps of measuring battery voltage and a temperature associated with the battery. This measured data is transmitted to a remote computing device and displayed thereby in real-time. Using the received voltage and temperature data, as well as a predetermined rated life of the battery, an estimate of remaining battery life is generated and displayed by the remote computing device.

BRIEF DESCRIPTION OF THE DRAWINGS

FIGS. 8A-8D are exemplary screen shots of a Warning Message Settings menu generated by a battery monitoring application according to an embodiment of the present disclosure.

FIG. 11 is an exemplary screen shot illustrating a battery efficiency estimation function of a battery monitoring application according to an embodiment of the present disclosure.

FIG. 12 is an exemplary screen shot illustrating a battery cycle counting function of a battery monitoring application according to an embodiment of the present disclosure.

FIGS. 15A-15C are exemplary screen shots illustrating the results of a battery charging test function performed by a battery monitoring application according to an embodiment of the present disclosure.

DETAILED DESCRIPTION

Figure 1:
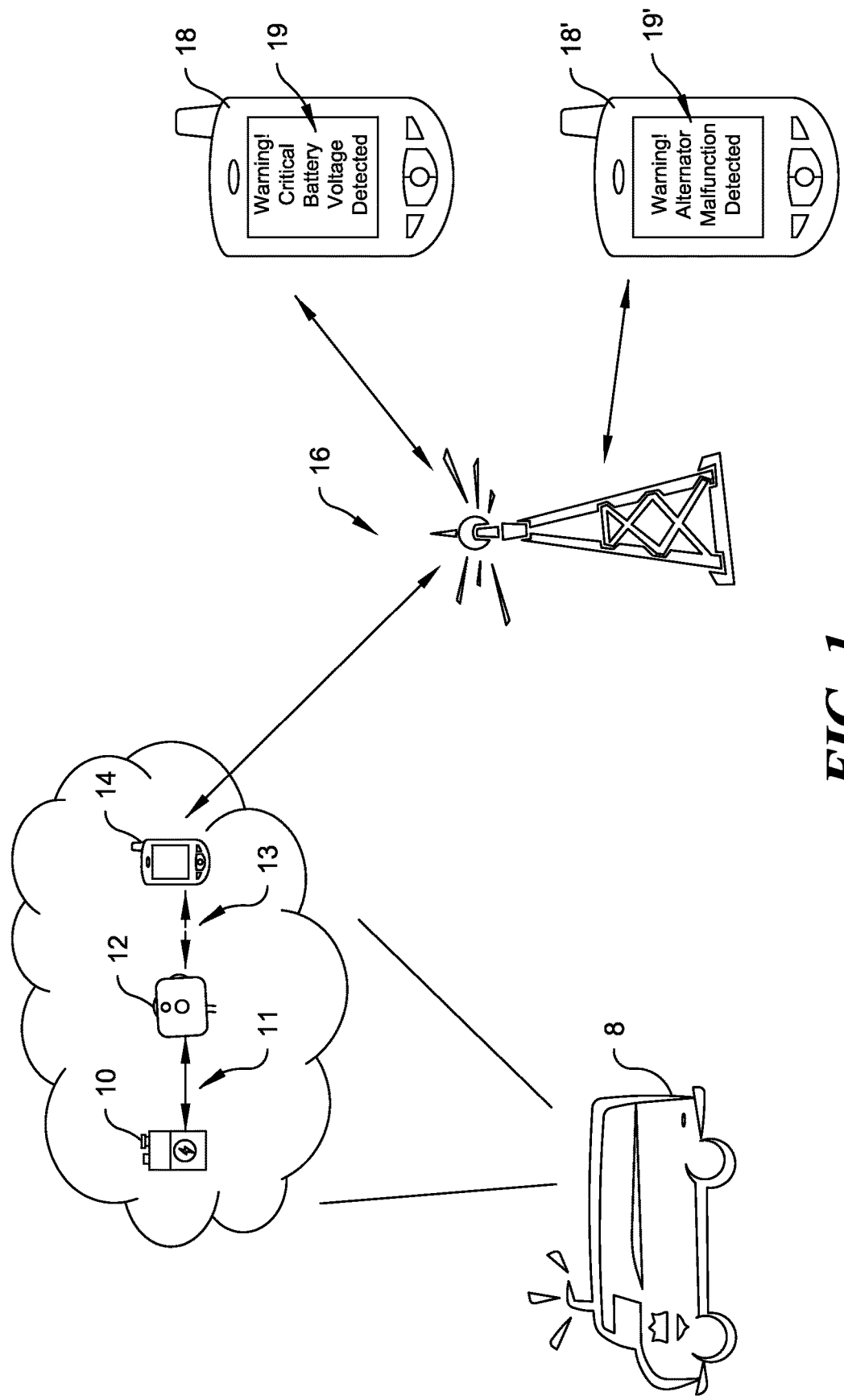
FIG. 1 illustrates an exemplary remote battery monitoring system architecture according to embodiments of the present disclosure.

It is to be understood that the figures and descriptions of the present invention have been simplified to illustrate elements that are relevant for a clear understanding of the present invention, while eliminating, for purposes of clarity, many other elements found in typical sensing and wireless communications systems, such as temperature sensors, and Bluetooth-based and cellular wireless communication systems. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present disclosure include systems and methods for remotely monitoring the status of a battery (e.g. battery voltage), as well as estimating remaining battery life based on any number of considerations, including measured charge and discharge cycles, environmental conditions and battery age. Referring generally to FIG. 1, a high-level diagram of an exemplary system architecture is provided for describing embodiments of the present disclosure. In one embodiment, a battery monitor 12 is provided for attaching to a battery 10 to be monitored (e.g. an automotive battery of a vehicle 8). Battery monitor 12 may be operatively attached to battery 10 via, for example, conductive leads 11 placed on the terminals of the battery. Battery monitor 12 is configured to measure one or more battery and environmental characteristics. For example, battery monitor 12 may include a voltage detection circuit an/or an impedance measuring circuit for measuring battery voltage and/or impedance in real-time.

Moreover, as battery life is affected by many different factors in addition to the power demanded by an associated load, one or more environmental characteristic sensors (e.g. temperature, humidity, altitude and/or pressure sensors) may also be provided as part of battery monitor 12. Data measured by these sensors, as well as a record of the time and date when the data was measured, may be stored in a memory device included in battery monitor 12. Battery monitor 12 may also comprise a wireless communications system, such as a Bluetooth transmit/receive system compliant with the standard, for establishing a wireless data connection 13. Other short range wireless communications technologies may also be used. Data connection 13 may be used to transmit measured battery and environmental data to a remote computing device 14, such as a cellular phone or personal computer.

Still referring to FIG. 1, embodiments of the present disclosure further include software-based applications for utilizing input and/or measured battery, environmental, and temporal data for providing accurate remote battery monitoring and battery life prediction or estimation functions. Such applications may include processor-executable instructions that are stored on memory devices local to a device processor, such as a personal computer, laptop, tablet computer, cellular phone (e.g. remote computing device 14 running an iOS or Android-based application), or other device, and are executed by a device processor, such as a CPU of a personal computer or an applications processing unit of a cellular phone. References to steps or tasks performed by an application herein should be understood as tasks performed by one or more processors executing computer-readable instructions stored in a non-transitory form in one or more storage devices, which instructions comprise all or part of an application. In one embodiment, an application may be downloaded from a remote server (e.g. via the internet) onto the personal computer or cellular phone according to known methods.

The application may be synched or otherwise associated with battery monitor 12 and configured to receive transmitted battery and environmental data therefrom. In an embodiment, battery monitoring device 12 and remote computing device 14 may both be configured to employ the Bluetooth standard for mutual device recognition and transmission of data from the battery monitoring device. Using this received data, the application may be configured to determine a current battery status and provide an output indicative thereof from remote computing device 14, such as on a device display or by sound output or vibration. The application may also be configured to cause remote computing device 14 to generate and transmit warnings or updates according to any number of considerations. For example, low-battery warnings or battery charging failures may be provided by a warning screen appearing on remote computing device 14. In other embodiments, the application may cause remote computing device 14 to generate one or more communications including these warning messages, such as an e-mail communication to a designated e-mail address, an SMS message transmitted via a cellular network 16 to other remote computing devices 18,18', or via another type of message to another address or device. These warning messages 19,19' may be displayed on remote devices 18,18'. Warnings may also be generated according to any environmental considerations. For example, warnings for excessive heat or cold conditions measured by the battery monitor may be generated and provided to a user. Warnings that the monitor is not functioning within parameters or is disconnected from battery 10 may be generated and provided to one or more devices or users. In one embodiment, any warning messages transmitted from remote computing device 14 may also include an indication of the location of the device (e.g. generated by the device's on-board GPS).

Moreover, embodiments of the application may be configured to generate estimated or predicted battery life data according to at least the data received from battery monitor 12. For example, the application may be configured to execute one or more formulas, in which the factors thereof may include one or more of the number, length and magnitude of any measured charge and discharge cycles, a known rated battery life, measured battery voltage and/or impedance, the temperature of the battery during the cycles as well as during any periods when the battery is not in use, and the temperature and/or humidity of the environment at any and all times, in order to generate an estimated remaining battery life. This battery life data may be provided to a user (e.g. the user of remote computing device 14), as well as automatically forwarded to remote devices 18,18'.

Further still, in embodiments an application may prompt a user to provide battery information, such as battery type, application, brand, model number or the like. Based on input battery information, the application may access associated thresholds for providing warnings, battery life determination formulas, and other operational variations dependent on battery information. In embodiments, different applications may be provided for download and associated with different types of batteries. Such different applications may differ in thresholds for warnings, formulas for determining battery life, and other data.

Figure 2A:
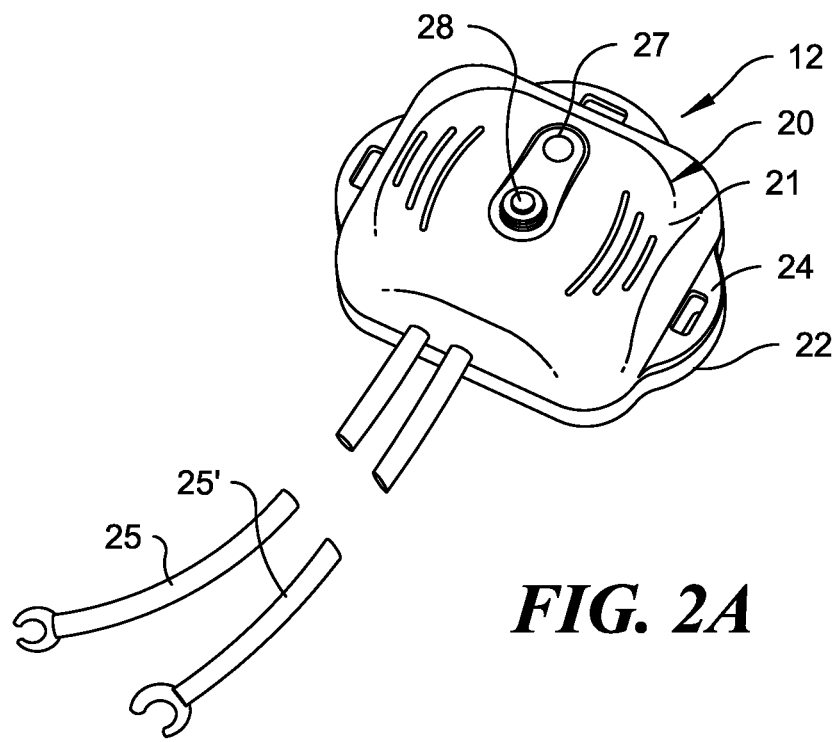
FIGS. 2A-2C include top, bottom and exploded isometric views of a battery monitor according to an embodiment of the present disclosure.
Figure 2B:
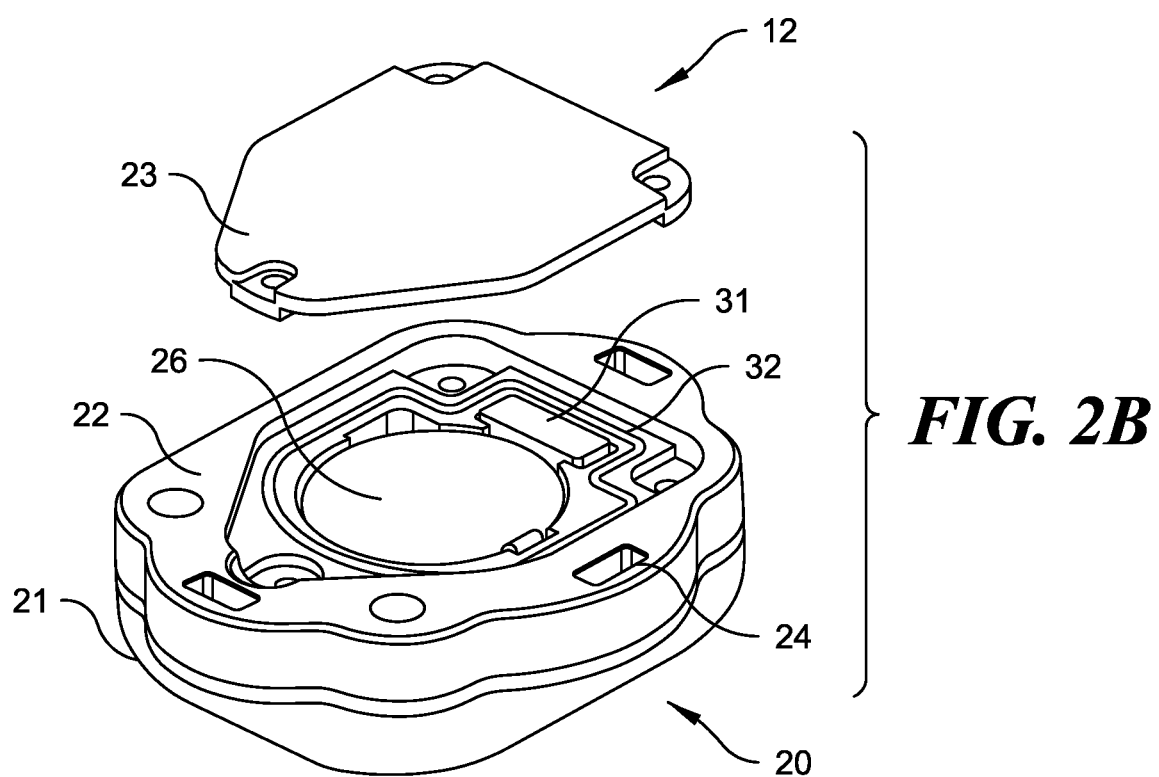
Figure 2C:
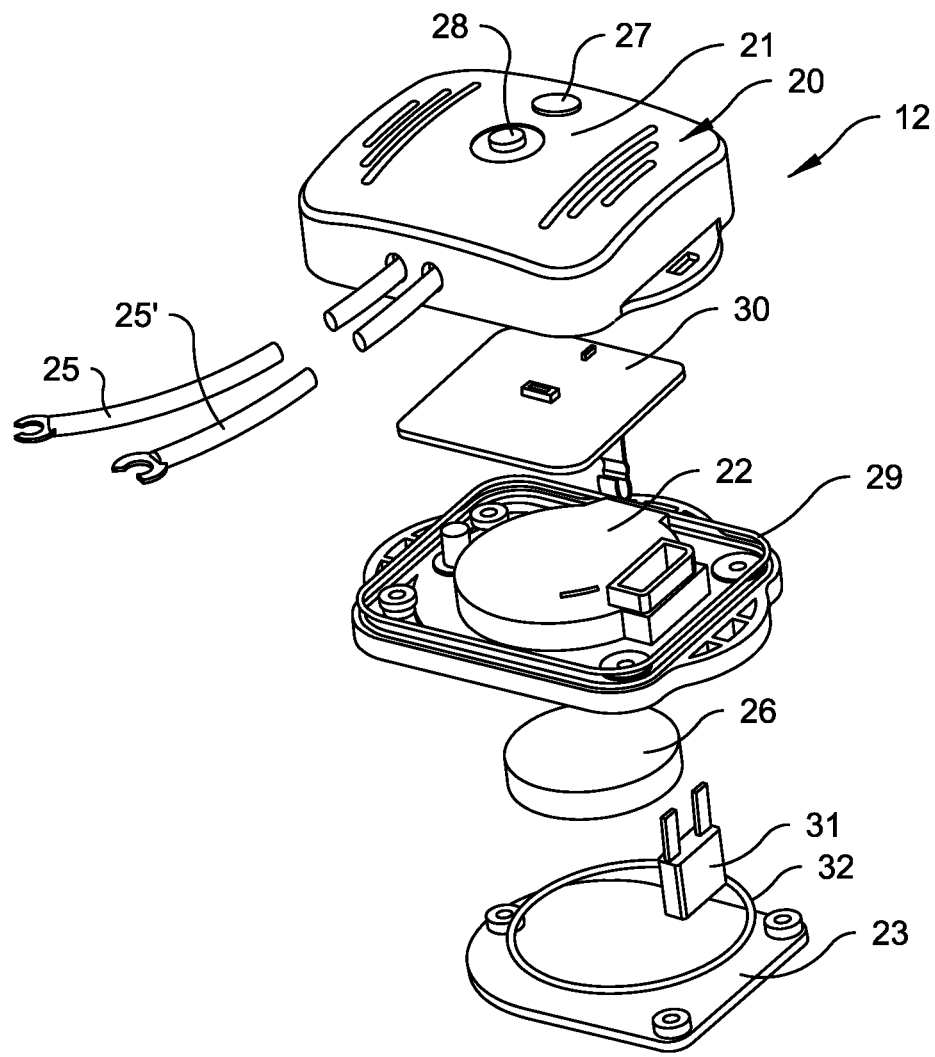

Referring generally to FIGS. 2A-2C, an exemplary battery monitor 12 according to an embodiment of the present disclosure is shown in greater detail. Battery monitor 12 comprises a housing 20, including an upper housing 21, lower housing 22 and a removable cover 23. Housing 20 may be constructed of any material, such as plastic or other polymers, and may be fire retardant and chemical resistant. Housing 20 may include one or more flanges or other projections 24 each defining an opening which may be used to mount battery monitor 12 proximate a battery to be monitored, or directly thereto, via for example, bands or fasteners (not shown).

Housing 20 may be configured to hold an electronics package 30. Electronics package 30 may include, for example, a voltage detection circuit and an impedance measuring circuit, one or more environmental sensors (e.g. temperature, humidity, altitude and/or pressure sensors), a wireless communications system (e.g. a Bluetooth transmitter or transceiver), and one or more control processors associated with one or more memory devices. The voltage and impedance circuits may be connected to the terminals or poles of a battery to be monitored via external leads 25,25'. Battery monitor 12 may also include one or more visual status indicators, such as LEDs 27 in one or more colors, as well as a test button 28, for providing a user with an on-command visual indication of the state of a battery connected thereto.

Electronics package 30 may be contained in a housing space defined between the upper and lower housings 21,22. An internal seal 29 (e.g. a rubberized sealing ring) may be provided for preventing moisture or other contaminants from entering housing 20. Battery monitor 12 may be configured to be powered from the monitored battery and/or may be powered by an on-board power supply, such as battery 26. In some embodiments, battery monitor 12 will run off of power supplied by the monitored battery until the monitored battery voltage falls below a predetermine threshold, after which battery monitor 12 will run off battery 26 as a backup. In the illustrated embodiment battery 26, as well as a protective fuse 31 associated therewith, are stored between lower housing 22 and removable cover 23. A second internal seal 32 is provided to prevent moisture or other contaminants from entering the space occupied by battery 26.

Figure 3:
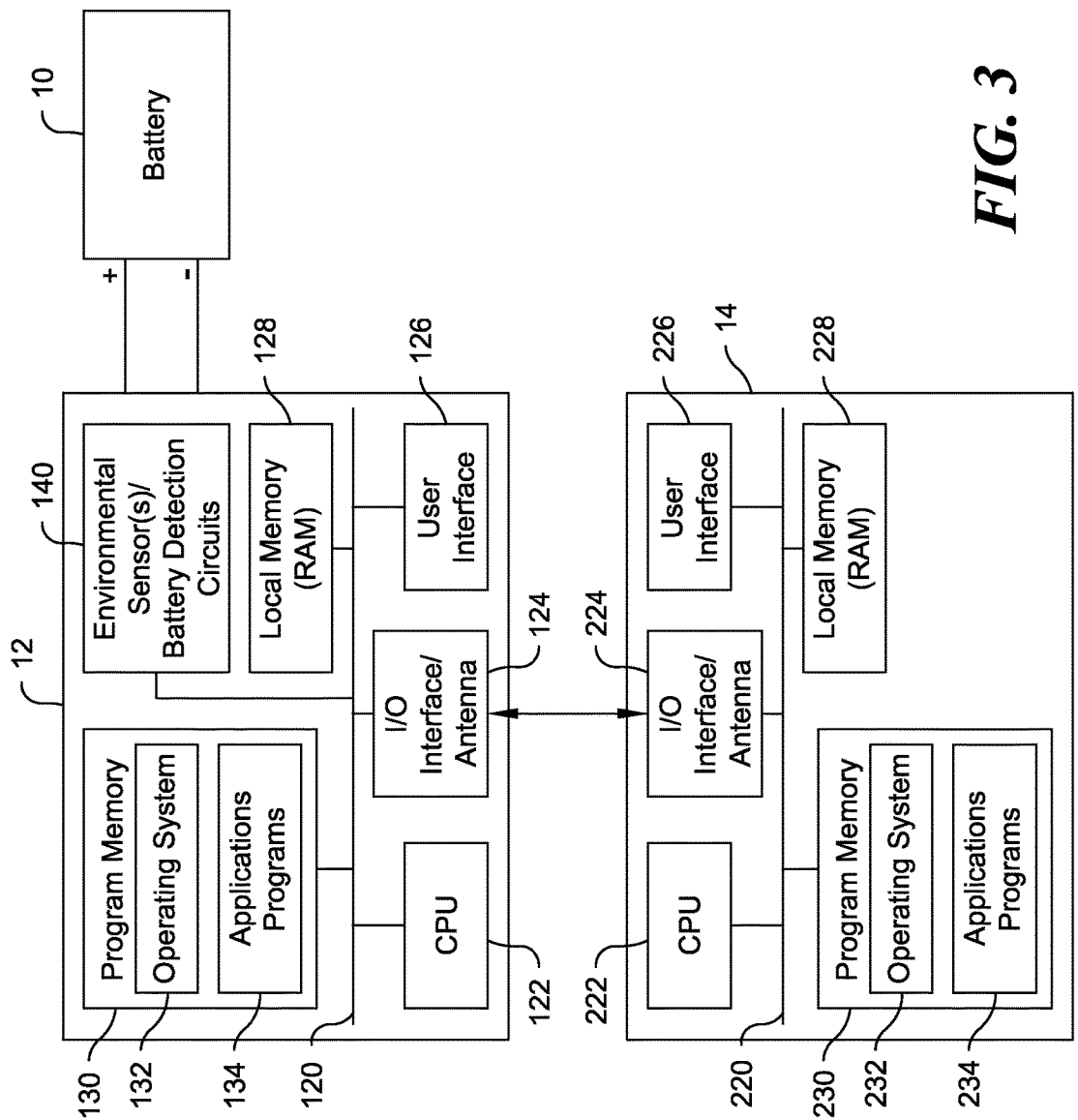
FIG. 3 is a simplified schematic diagram of a battery monitoring system, including a battery monitor and a remote computing system, in accordance with an exemplary embodiment of the present disclosure.

Referring generally to FIG. 3, a simplified schematic block diagram of exemplary battery monitor 12 and exemplary remote computing device 14 (e.g. a cellular phone) in accordance with an embodiment of the present disclosure is shown. As set forth above, battery monitor 12 may comprise battery characteristic detection circuits, such as voltage and impedance detection circuits, as well as one or more environmental sensors 140 (e.g. temperature and humidity sensors). The voltage detection and impedance measuring circuits may be operatively connected to battery 10 for measuring its voltage and impedance characteristics.

One or more computer processors, designated by central processing unit (CPU) 122, is in communication via a data bus 120 with components including program memory 130, local memory 128, user interface 126 (e.g. test button 28 of FIG. 2A), and input/output interface 124 (e.g. a Bluetooth transmitter or transceiver) including a wireless antenna. Program memory 130 stores programs including an operating system (OS) 132, which manages the hardware and provides common services for efficient execution of various logic circuitry including hardware, software and/or programs. Program memory 130 further stores one or more operations programs 134, which include computer-executable instructions to execute rules to perform each of the processing functions described herein, such as the storage and transmission of measured battery data (e.g. voltage and impedance) and environmental data (e.g. temperature), the performance of any additional functions (e.g. a battery test function initiated via user interface 126), as well as the control of communications between battery monitor 12 and other external devices, such as remote computing device 14. Processor 122 (or CPU) carries out the instructions of computer programs, which operates and/or controls at least a portion of the functionality of battery monitor 12. Program instructions may be loaded into local memory 128 for efficient and high-speed execution by CPU 122. Programs may be arranged in one or more modules, and functionality of programs may be implemented in program code that may be arranged as one or more programs or modules, which need not be stored on a same memory device, or executed by a single CPU.

Input/output interface 124 is configured to receive and output data and information to and/or from battery monitor 12 from and/or to peripheral devices and networks operatively coupled to the system (e.g. a wireless connection using the Bluetooth standard with remote computing device 14). Input/output interface 124 may include a query interface configured to accept and parse requests from remote computing device 14, as well as any other external systems, and pass those requests to CPU 122 for further processing. Program memory 130 may include one or more of any form of data storage device including but not limited to electronic, magnetic, optical recording mechanisms, combinations thereof or any other form of memory device capable of storing data. The CPU 122 may be in the form of one or more computer processors, or other suitable automated information processing system capable of executing instructions stored in program memory.

Similarly, remote computing device 14 such as a cellular or smart phone, includes a data bus 220 providing communication among system components. One or more computer processors, designated by CPU 222, is in communication via data bus 220 with components including program memory 230, local memory 228, user interface 226 (e.g. a touch-screen), and input/output interface 224 (e.g. a Bluetooth compliant or other wireless transceiver) including a wireless antenna. Program memory 230 stores programs including an operating system (OS) 232, which manages the hardware and provides common services for efficient execution of various logic circuitry including hardware, software and/or programs. Program memory 230 further stores one or more operations programs 234, which include computer-executable instructions to execute rules to perform the processing described herein, such as the reception and storage of measured battery data, environmental data and any user-entered data, the performance of any battery life estimating functions, the generation of display screens and other visual indicators, the generation and transmission of warning messages or other alerts, as well as the control of communications between battery monitor 12 and remote computing device 14. Processor 222 (or CPU) carries out the instructions of computer programs, which operates and/or controls at least a portion of the functionality of remote computing system 110. Program instructions may be loaded into local memory 228 for efficient and high-speed execution by CPU 222. Programs may be arranged in one or more modules, and functionality of programs may be implemented in program code that may be arranged as one or more programs or modules, which need not be stored on a same memory device, or executed by a single CPU. Program memory 230 may also include one or more of any form of data storage device including but not limited to electronic, magnetic, optical recording mechanisms, combinations thereof or any other form of memory device capable of storing data. The CPU 222 may be in the form of one or more computer processors, may include separate application processing unit, including one or more processors and display processing units. In embodiment, CPU 222 may be in such forms as a distributed computing system, a centralized computing system, a network server with communication modules and other processors, or nearly any other automated information processing system capable of executing instructions stored in program memory.

Each or any combination of the modules and components shown in FIG. 3 may be implemented as one or more software modules or objects, one or more specific-purpose processor elements, or as combinations thereof. Suitable software modules include, by way of example, an executable program, a function, a method call, a procedure, a routine or sub-routine, one or more processor-executable instructions, an object, or a data structure.

Figures 4, 5A, 5B:
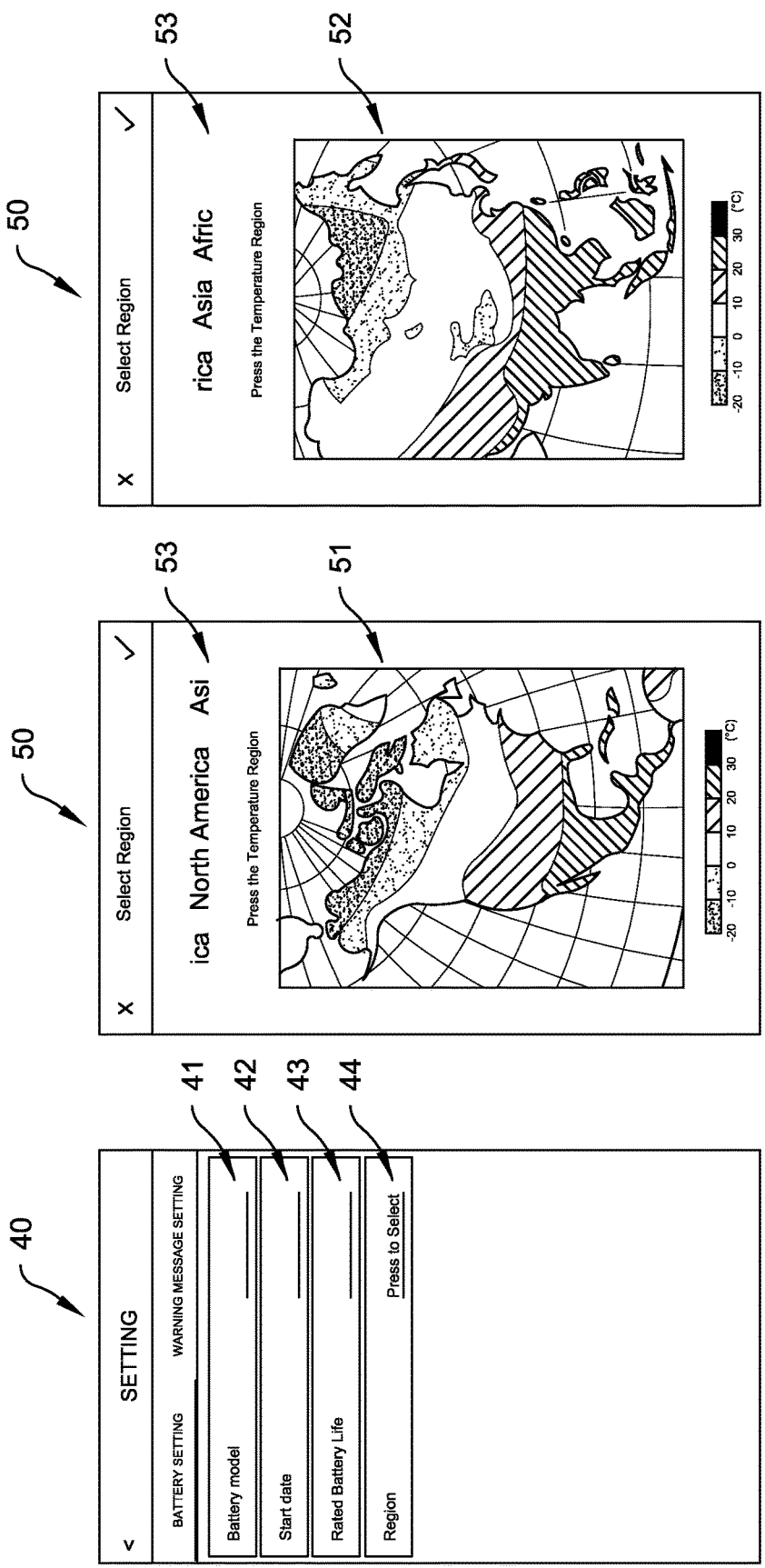
FIG. 4 is an exemplary screen shot of a Battery Setting menu generated by a battery monitoring application according to an embodiment of the present disclosure.
FIGS. 5A and 5B are exemplary screen shots of a Temperature Region selection menu generated by a battery monitoring application according to an embodiment of the present disclosure.

FIG. 4 illustrates an exemplary Battery Settings menu 40 of an application according to an embodiment of the present disclosure. As set forth above, battery monitoring applications according to embodiments may generate estimated remaining battery life data for providing to a user. In one embodiment, this estimation of battery life may utilize user-provided information. For example, a user may enter a battery model number of the battery being monitored into an input field 41 provided on the device (e.g. a touch-screen input field generated by an application running on remote computing device 14). In one embodiment, the application may cross-reference this input battery model with a stored battery information database containing, for example, rated battery life (e.g. in amp-hours, Ah), battery output voltage, and the like associated with the identified battery model. In another embodiment, the user may enter a start date associated with the battery into another input field 42 (e.g. a date the battery was put into service). A known rated battery life may also be manually-entered by a user into the illustrated input field 43. Using the known rated battery life in conjunction with battery data (e.g. output voltage, duty cycle, etc.) measured by the battery monitor and a know length of time in service, an estimated remaining battery life may be generated and provided to a user. This output may take the form of, for example, a temporal notification, wherein an estimated time of remaining battery life according to average past usage may be calculated. Other embodiments may provide, for example, an estimated number of cycles remaining.

As described above, however, battery life is significantly impacted by environmental conditions. Accordingly, the application may also be responsive to geographic data for estimating one or more environmental conditions when performing battery life estimates. In this way, the application may more accurately predict future battery life. Still referring to FIG. 4, the Battery Settings menu may further comprise a Region selection feature (i.e. geographic region). Activation of a button or input 44 associated with the Region selection feature may launch a Region selection page 50 including a plurality of pre-stored maps 51,52 illustrating various geographic regions, as well as provide an indication of environmental characteristics associated with each region (e.g. a color-coded average temperature and/or humidity of each region), as shown in FIGS. 5A and 5B. A user may scroll through these maps using the illustrated selectable field 53, and select a geographic region associated with the location of the battery (e.g. via touching an area of the graphic or map 51,52 corresponding to said location). The application may use this identified geographic region for identifying known or historic environmental characteristics (e.g. average humidity and temperature) for use in performing battery life estimates according to embodiments of the present disclosure. This region-specific historic environmental data may be accessed from outside databases and/or pre-stored on the device. In still other embodiments, the application may rely on GPS data acquired from the phone or other device for estimating the geographic location of the battery being monitored. The application may have stored associations between geographic locations and one or more environmental conditions, or determine one or more environmental conditions associated with a geographic location of a battery based on one or more stored associations between a geographic region including a geographic location of a battery and one or more environmental conditions. In this way, a user is not required to identify a location associated with the battery for estimated geographical information and corresponding environmental conditions associated therewith.

Figure 6:
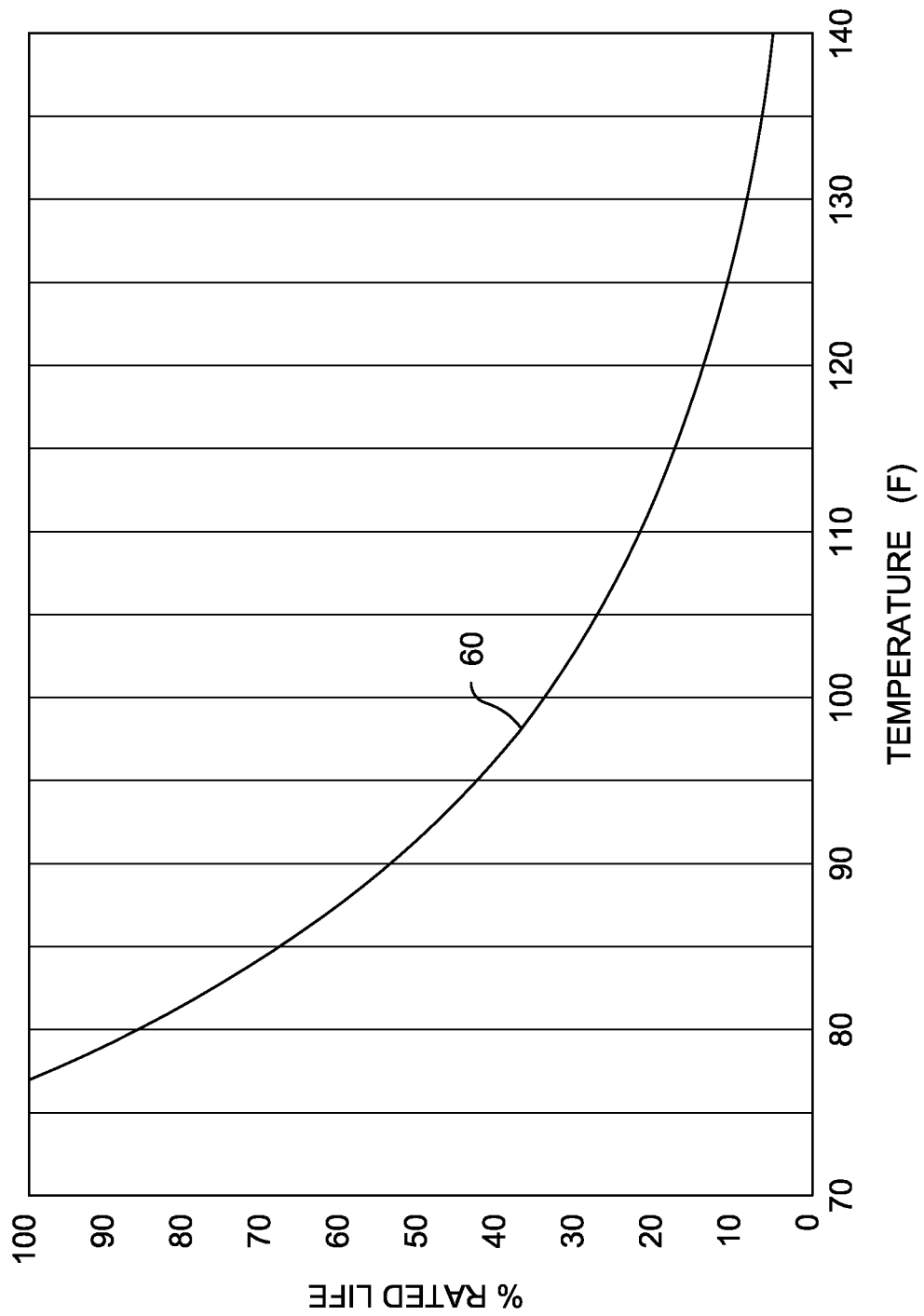
FIG. 6 is a graphical representation of an exemplary rated battery life factor vs. temperature relationship useful for estimating remaining battery life according to an embodiment of the present disclosure.

Using, for example, known average temperature data associated with the user-selected geographic region, the application may be configured to correlate the average temperature with a corresponding rated life adjustment factor or "stress factor" or "battery stress factor." In one embodiment, the application may access a relative expected battery life (e.g. a stress factor) vs. temperature relationship function 60 (e.g. for a given model or class of battery), as illustrated in FIG. 6 in order to identify a stress factor associated with a given temperature. This stress factor may be based on the following relationship:

$$L = L_0 \cdot \left(\frac{1}{2}\right)^{\frac{T-T_0}{T_1}}$$

wherein:

$L_0$ is the expected battery life at the reference temperature $T_0$;

$T_0$ is the temperature at which the device has life $L_0$;

$T_1$ is the temperature increase required to halve the expected life of the battery; and T is the actual operating temperature (or average temperature of a selected region).

The application may determine the stress factor corresponding to the known average temperature associated with the selected region. This stress factor may be used to compute estimated battery life by applying the factor to the known rated power of the battery, thereby increasing or decreasing an expected life thereof according to the stress factor. These so-called stress factors may correspond to selectable battery life estimation formulas. For example, a formula for a geographic region having high temperatures may result in shorter battery life determinations than a formula for a geographic region having relatively low temperatures. In more general terms, embodiments of the application may adjust values of variables, change variables, adjust weighting factors, and otherwise modify formulas for determining battery life, based on geographic areas.

In still other embodiments of the present disclosure, the application may use temperature data measured by the battery monitor to supplement the above temperature-corrected battery life estimations, or as the primary means of performing temperature or other environmental conditions-based battery life correction. For example, using an ideal, stored rated battery life, or a user-entered battery life, the application may rely on any number of measured parameters including voltage, temperature, time, humidity, duty cycle, charging and discharging characteristics, and known geographic information to modify an expected or ideal rated battery life. Using this modified expected battery life, past duty cycle data may be used to estimate an expected date or time interval until battery failure (or a predetermined battery voltage threshold is reached).

Moreover, as will be understood by one of ordinary skill in the art, changes in an impedance value of a battery may be a factor in determining battery life. In general, a greater rate of change in impedance value is indicative of a shorter battery life. Accordingly, battery monitors according to embodiments may include one or more impedance measuring circuits for determining battery impedance (and changes therein). The results of these measurements may be used as a factor in estimating remaining battery life as set forth in detail above.

Figure 7:
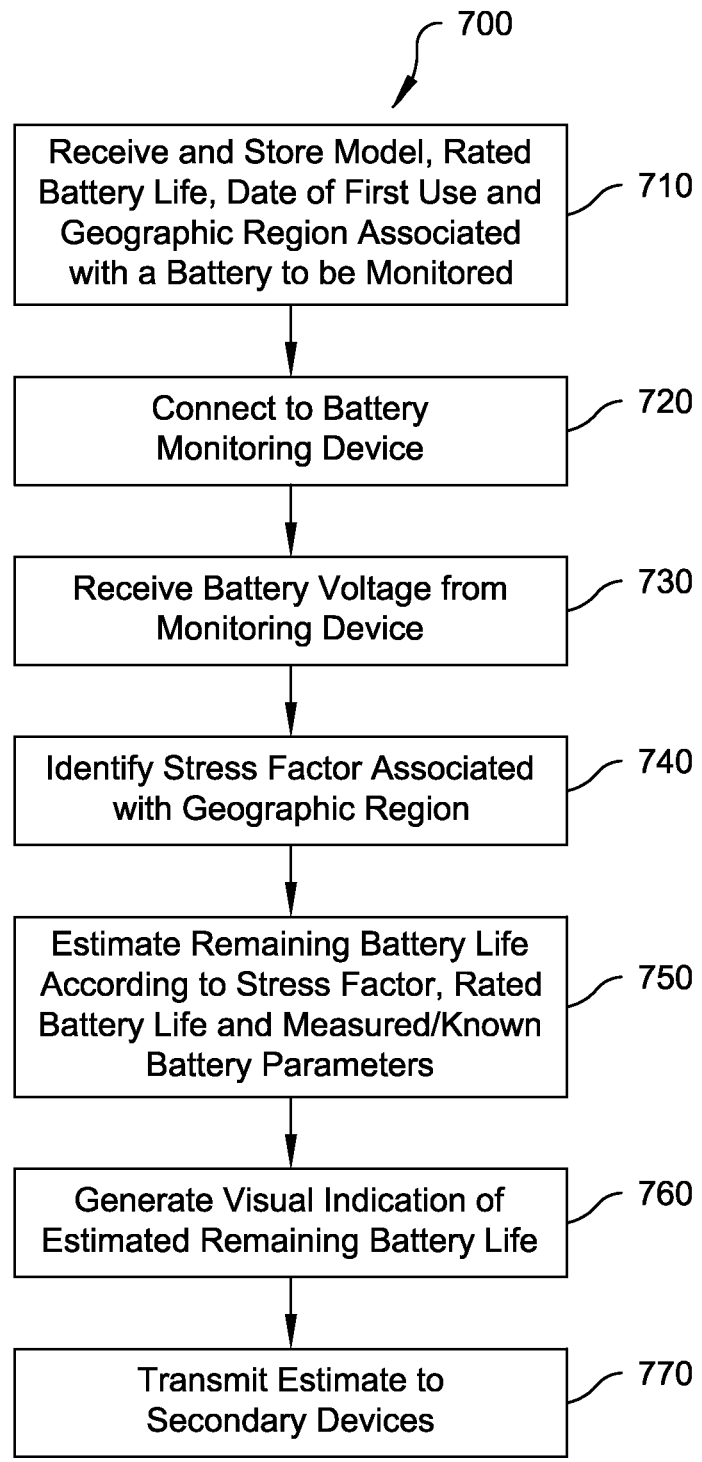
FIG. 7 is an exemplary process diagram illustrating a battery life estimation function performed by a battery monitoring application according to an embodiment of the present disclosure.

Referring generally to FIG. 7, a simplified process diagram is provided illustrating an exemplary battery life estimation function 700 of an application according to an embodiment of the present disclosure. An application running on a remote computing device may prompt a user to enter relevant information, such as known battery model, rated battery life information, the date of first use of the battery, as well as a geographic area or region associated with the battery being monitored. These inputs are stored 710 into memory for future use. The remote computing device may connect 720 to a battery monitor. This may be achieved automatically by, for example, standard Bluetooth handshake protocols. Once connected, the remote computing device may receive 730 battery data (and/or environmental data) measured by the battery monitor. This may include data being measured in real-time, as well as previously-measured data stored on the battery monitor and uploaded thereto after the connection. Upon a user command, or as part of an automatic routine, the application may generate an estimate of remaining battery life. As set forth above, in one embodiment, this may include accessing the stored battery information, including the rated battery life and date of first use. The application may further access the stored geographic information associated with the battery, and use it to identify or calculate 740 a corresponding stress factor associated therewith. This stress factor may be applied to the rated battery life (e.g. may be multiplied by the rated battery life), and the result may be used in conjunction with any other known battery parameters (e.g. duty cycle, time in service, temperature data, etc.), to estimate 750 remaining battery life (e.g. a time until battery depletion). Once estimated, the application may generate 760 a visual indication of the estimate and/or transmit 770 the estimate to one or more secondary devices (e.g. devices 18,18' of FIG. 1).

Figures 8A, 8B:
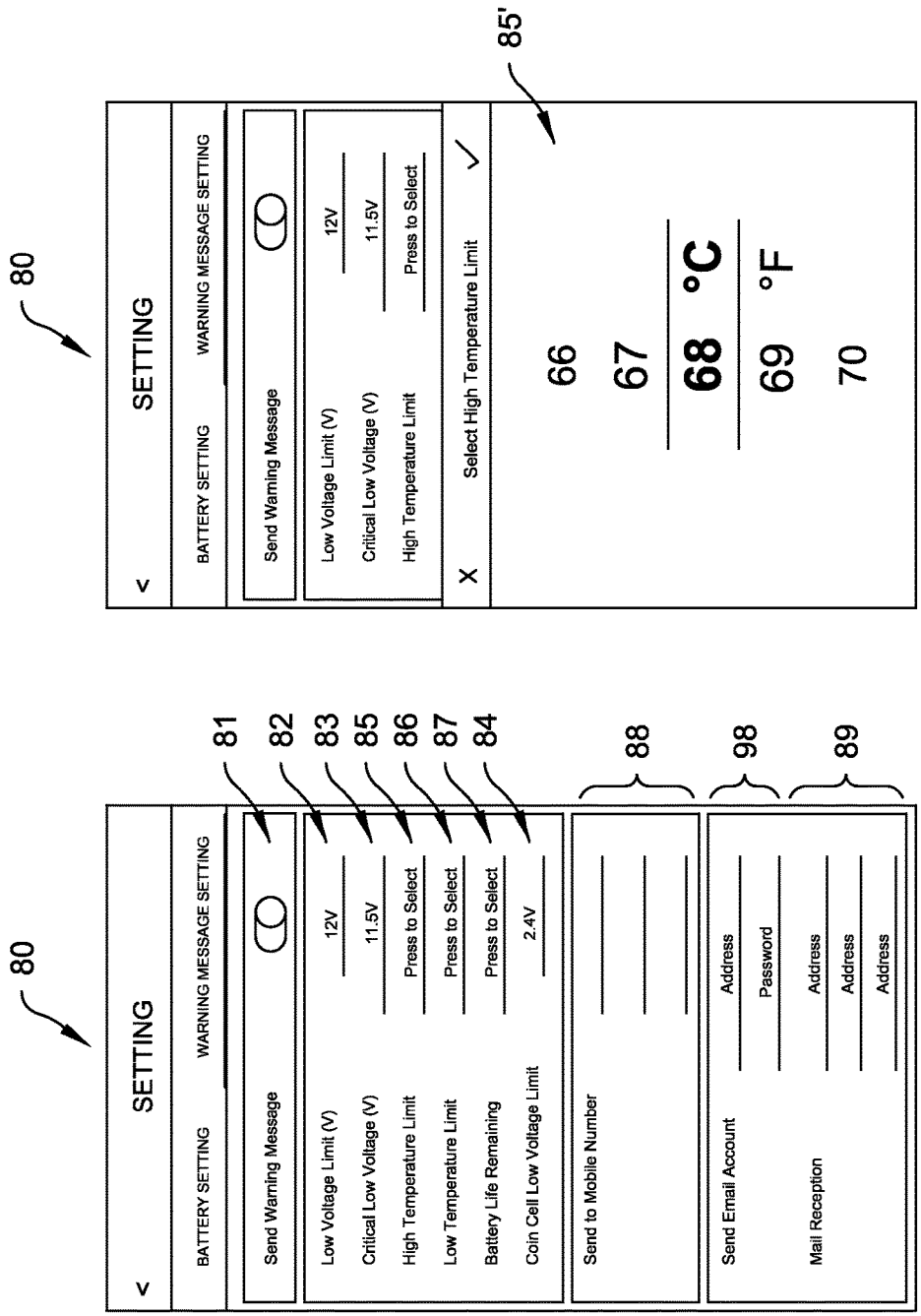
Figures 9A, 9B:
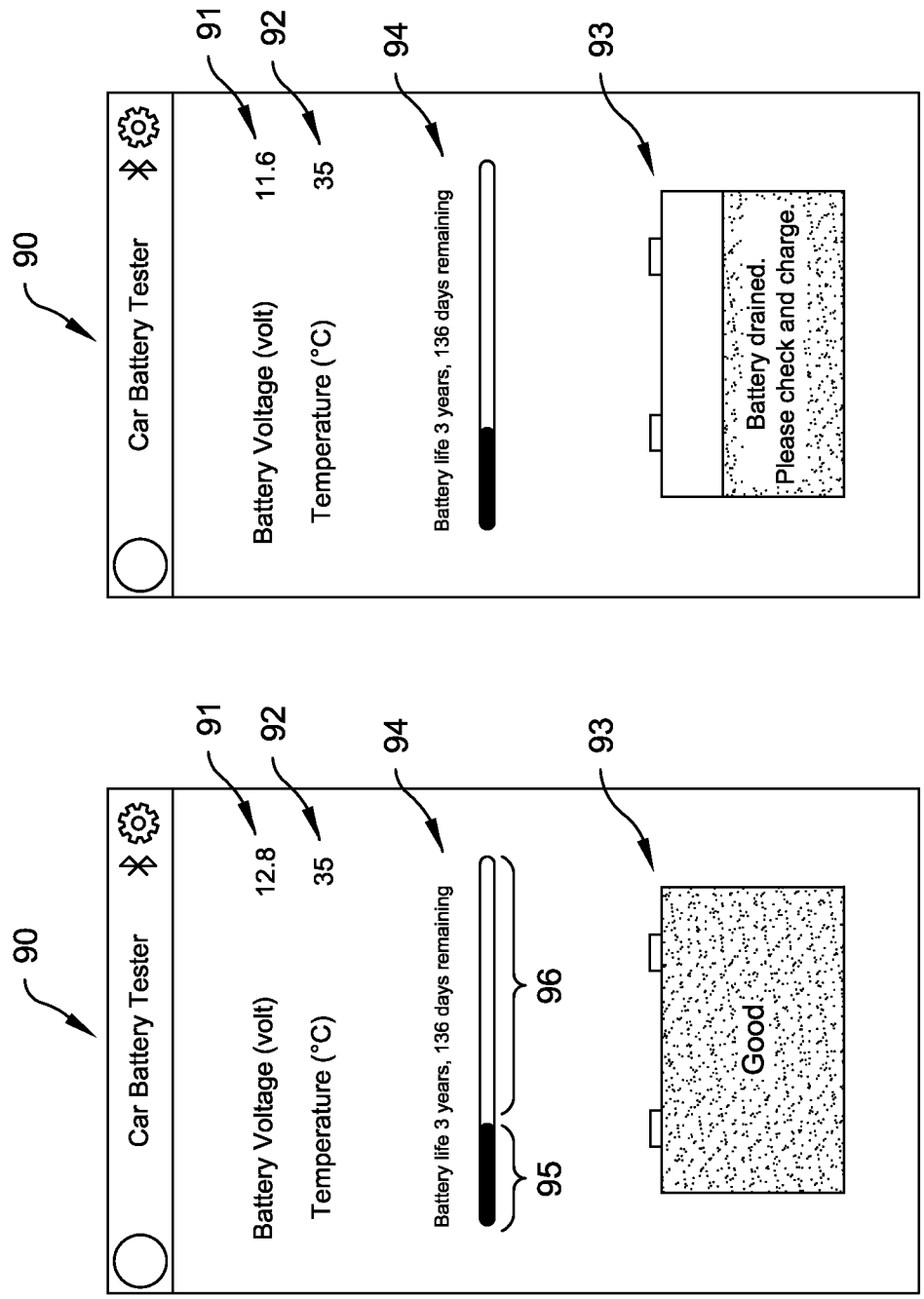
FIGS. 9A-9D are exemplary screen shots of a battery voltage and estimated battery life display function of a battery monitoring application according to an embodiment of the present disclosure.
Figure 9D:
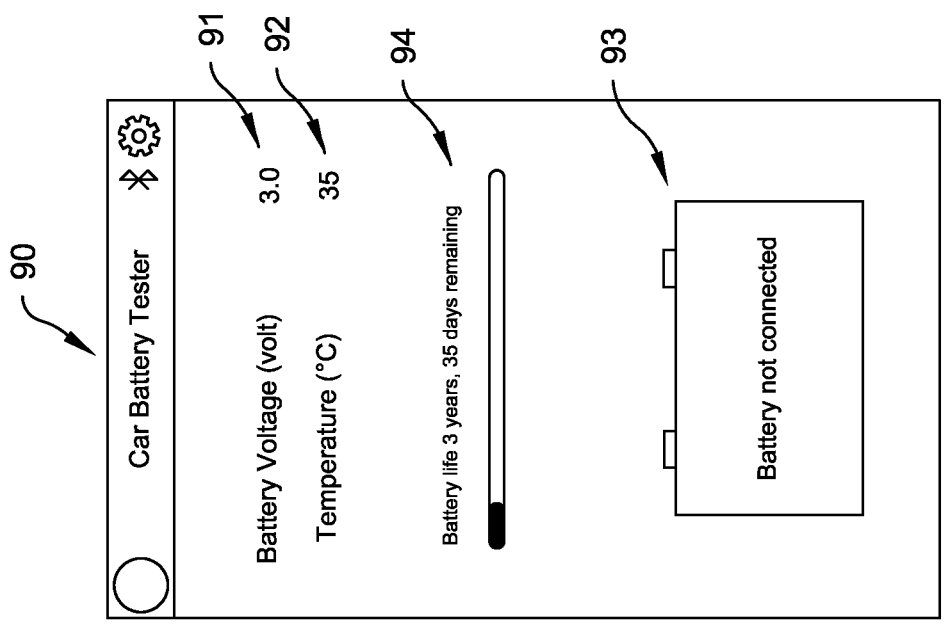
Figure 9C:
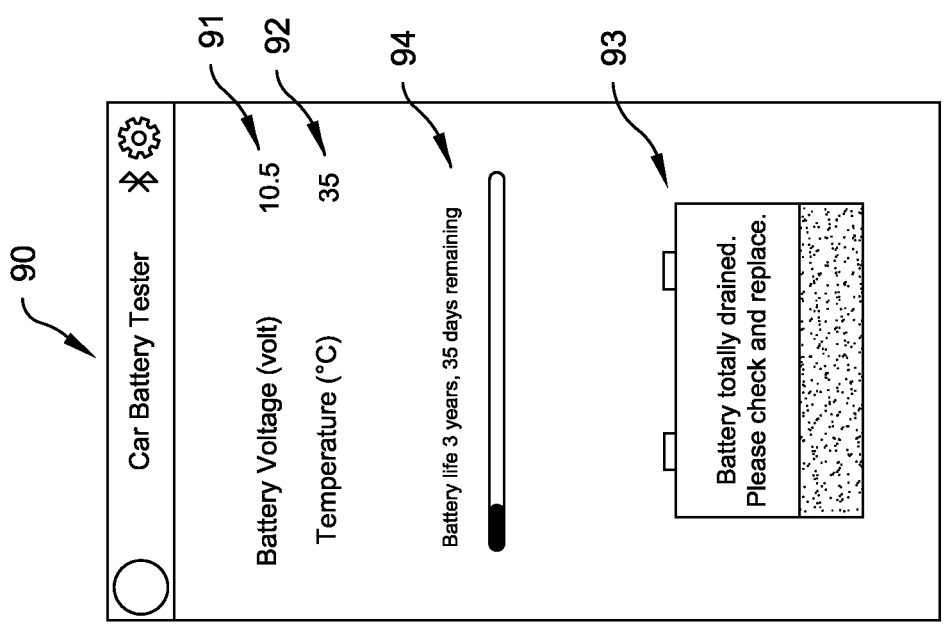

Referring generally to FIGS. 8A-8D, exemplary screen shots illustrating a Warning Message Setting menu 80 of a battery monitoring application according to an embodiment of the present disclosure are shown. Battery monitoring applications set forth herein may be operative to automatically generate a warning message when predetermined battery or environmental parameters or thresholds are reached. As illustrated in FIG. 8A, a user may selectively activate or deactivate a warning message function via a toggling, on/off button or input 81. The user may also set or enter into respective input fields 82,83,84 a first or low voltage limit, a second or critical voltage limit, and a low voltage limit for the battery monitor's on-board power supply (e.g. battery 26 of FIG. 2B). As shown in FIGS. 8B and 8C, a user may also set a critical high temperature limit and a critical low temperature limit. These limits may be set by, for example, selecting respective push-button inputs 85,86 for accessing respective drop-down temperature selection fields 85',86'. Referring to FIG. 8D, a user may also select a remaining battery life button or input 87 for entering a predetermined temporal limit (e.g. indicative of a user's own estimate of remaining battery life) via a drop-down duration field 87'.

Referring again to FIG. 8A, as described above, automatic warnings may be selectively generated when any of these limits are reached. These warnings may be displayed on the host remote computing device, as well as transmitted according to a user's selected preferences. More specifically, a user may selectively activate several different warning types. For example, a visual warning may be automatically displayed on the host remote computing device. Moreover, a user may enter one or more mobile phone numbers into input fields 88, wherein a warning message may be automatically sent (e.g. via SMS message) when the predetermined voltage, temperature or temporal threshold(s) is reached. In addition, the application may be operative to send email-based messages to one or more recipient email addresses entered into input fields 89. As shown, in one embodiment, a user may enter the information (e.g. username and password) of an originating (sending) email account into an input field 98 for automatically generating the warning e-mail messages.

It should be understood that information relating to estimated remaining battery life or current battery status may be conveyed to a user in any number of ways beyond those set forth above. For example, a user may access via the application a display including battery life estimate corresponding to a desired future date (i.e. the user may request an estimate of remaining battery life at some future data). The application may also generate a date at which the battery is estimated to reach a critical power or voltage level. This level may be predetermined by the application based on known battery specifications, or may be entered by a user. In this way a user may set their own critical battery limit, and receive a warning at, or in advance of, the battery reaching this limit.

FIGS. 9A-9D illustrate exemplary screen shots of a Car Battery Test mode menu 90 generated by a battery monitoring application according to an embodiment of the present disclosure. As shown, a remote computing device running the application may be responsive to received battery voltage and temperature data for generating visual indications of battery status. These indications may include displaying real-time measured battery voltage 91 and temperature 92, as well as a color-coded graphic 93 indicating battery status (e.g. green=good, FIG. 9A; yellow=warning, FIG. 9B; red=critically low level, FIG. 9C; and a connection error warning, FIG. 9D). As shown, each of graphics 93 may also include text-based status identifications included therein. The threshold voltage levels used to designate between each of these levels may correspond to those set by the user as described above with respect to FIGS. 8A-8D. They may also be predetermined according to known characteristics of the battery being monitored, or may be calculated by a processor of, for example, the remote computing device after receiving measured voltage data from the battery. As illustrated, the application may also provide a text-based indication 94 of an estimated remaining battery life calculated according to the above-described processes. The application may also provide a visual indication of remaining battery life in the form of a status bar illustrating a proportional amount of previously-expended battery life 95 and a corresponding proportional amount of remaining battery life 96.

Figures 10A, 10B, 10C:
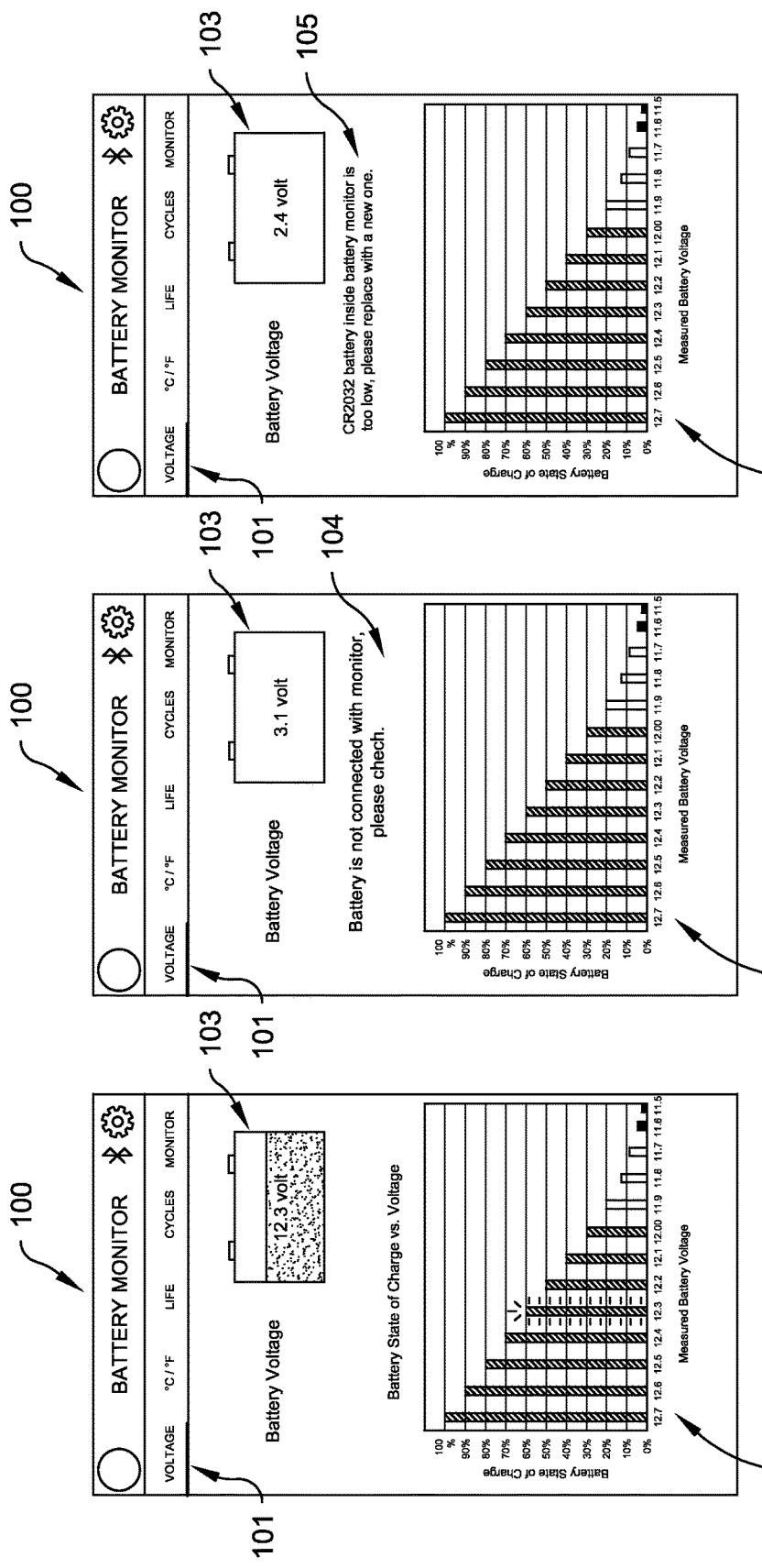
FIGS. 10A-10C are exemplary screen shots illustrating a battery voltage display function of a battery monitoring application according to an embodiment of the present disclosure.

FIGS. 10A-10C are exemplary screen shots of a voltage sub-menu 101 of a Battery Monitor menu 100 illustrating additional display functions of a battery monitoring application according to an embodiment of the present disclosure. Voltage sub-menu 101 may include a graphical representation 102 relating various battery voltages to a percentage of a battery's charging state. A battery voltage corresponding to the measured battery voltage may be illuminated or otherwise identified as illustrated. An additional graphic indication 103 illustrating real-time battery voltage may also be provided. FIGS. 10B and 10C illustrate exemplary warning messages that may be provided to a user according to measured battery voltage. For example, FIG. 10B illustrates a text-based connection warning error 104, wherein the measured battery voltage appears to correspond only to the on-board power supply (e.g. battery 26 of FIG. 2B), indicating that the battery monitor is not connected to a battery to be monitored. Likewise, FIG. 10C illustrates a text-based warning error 105 indicating that the on-board power supply has reached (or has fallen below) a predetermined critical level, such as that set by the user (see FIG. 8A).

FIG. 11 provides an exemplary screen shot of a battery efficiency sub-menu 106 of a battery monitoring application according to an embodiment of the present disclosure. The application may be configured to generate a visual indication of temperature 107 (e.g. battery temperature or ambient temperature) measured by an associated battery monitoring device. The application may also display a graphical indication of battery efficiency 108 at this measured temperature. Efficiency data for one or more different battery types may be pre-stored into a memory of the host device running the application.

Figures 13, 14:
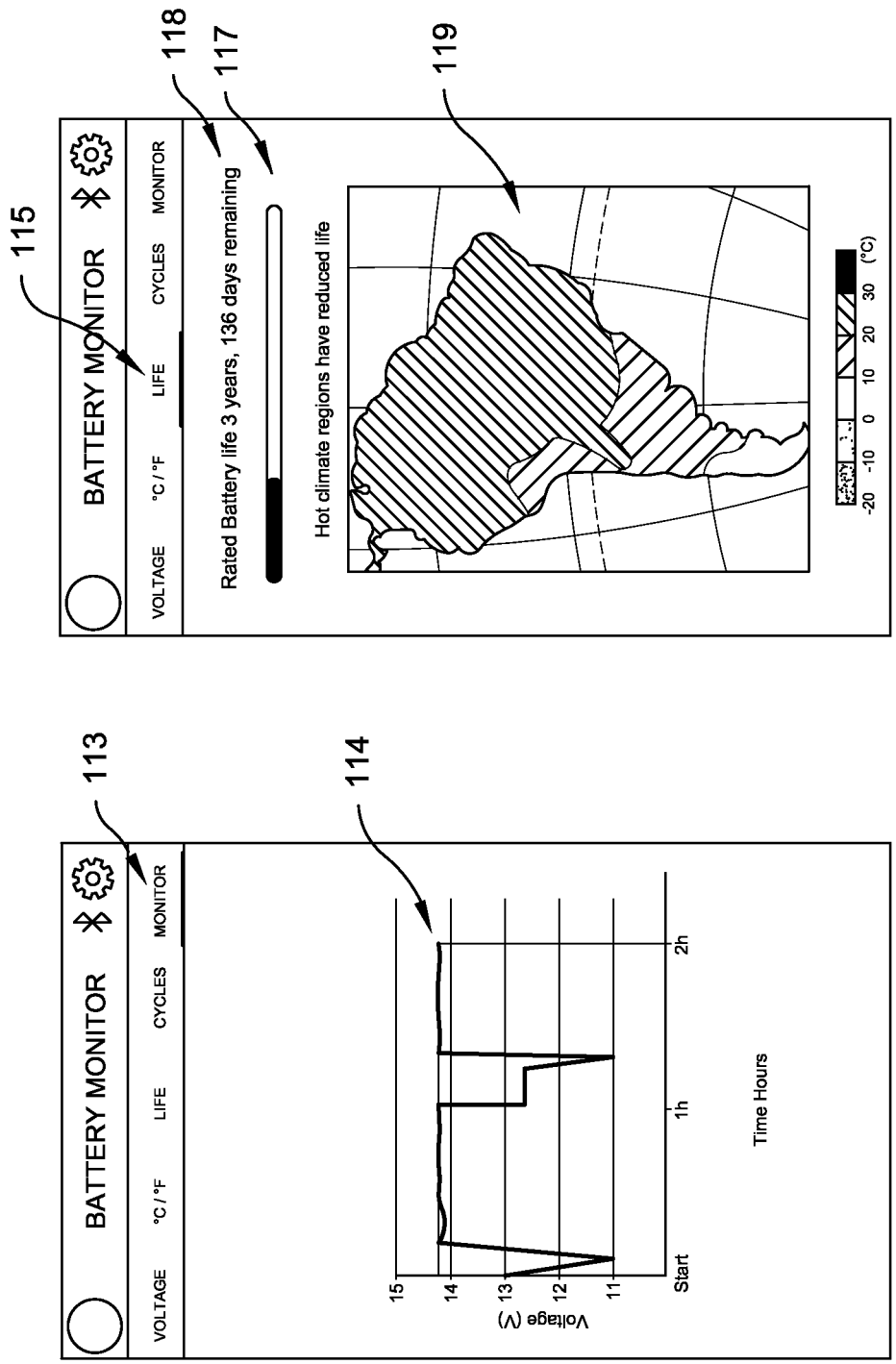
FIG. 13 is an exemplary screen shot illustrating a real-time battery voltage monitoring function of a battery monitoring application according to an embodiment of the present disclosure.
FIG. 14 is an exemplary screen shot illustrating a remaining battery life estimating function of a battery monitoring application according to an embodiment of the present disclosure.

Referring generally to FIG. 12, embodiments of a battery monitoring application may include a cycle tracking sub-menu 109 for displaying a generated and stored temporal record of charge/discharge cycles of a battery being monitored. In addition to a graphical representation 111 of a number of cycles vs. time, a text-based indication 112 of a total cycle number may also be provided to a user. FIG. 13 illustrates a monitoring sub-menu 113, including a real-time battery voltage vs. time graphical representation 114 which may be generated by a battery monitoring application according to embodiments of the present disclosure. FIG. 14 illustrates another battery life sub-menu 115, in which graphic (e.g. a status bar as set forth above with respect to FIGS. 9A-9D) and text-based estimates of battery life 117, 118 are shown, in addition to a graphical representation 119 of a geographical region associated with the battery.

FIGS. 15A-15C are exemplary screen shots illustrating a battery charging function or display mode (e.g. an alternator status) of a battery monitoring application according to an embodiment of the disclosure. As shown, in a Car Battery Tester display menu 150, the battery monitoring application is configured to generate a visual indication 151 of measured battery voltage (e.g. charging voltage). Embodiments may include additional graphical indications 152,156,157 relating to alternator function. For example, in the case a typical 12V automotive battery, a measured voltage below a predetermined ideal charging voltage range (e.g. 13.5-14.8V) may generate an indication 152 of a potentially failing alternator (FIG. 15A), a measured battery voltage falling within this range may generate an indication 156 of a properly-functioning alternator (FIG. 15B), while a voltage exceeding this range may generate an indication 157 of a problem with the alternator (FIG. 15C). In addition, the application may provide a text-based indication 153 of received temperature data as well as a battery life estimate 154 (as described above with respect to FIGS. 9A-9D). A graphical indication 155 identifying the presence of a predetermined sufficient battery voltage to, for example start an automobile, may also be provided.

Figure 16:
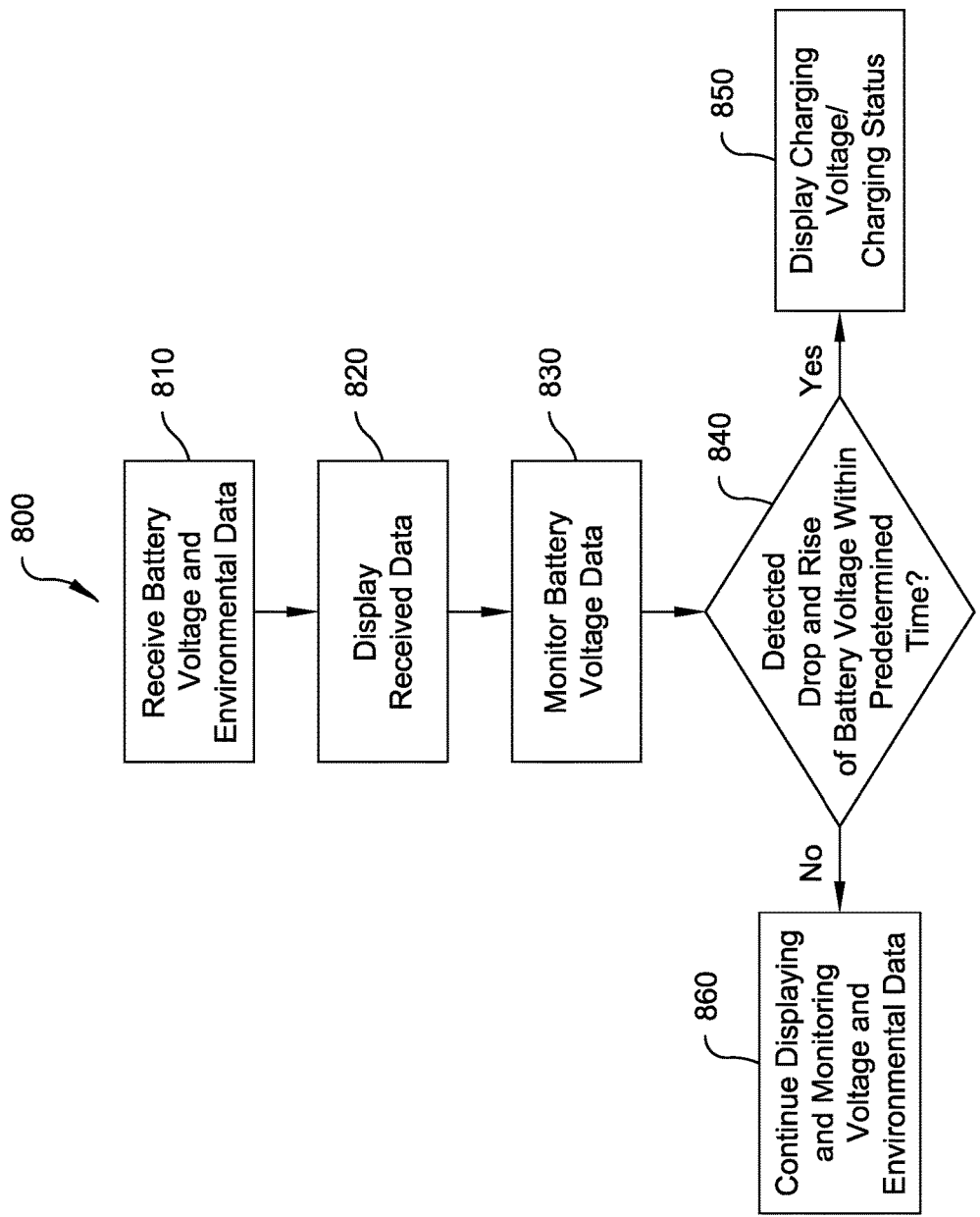
FIG. 16 is an exemplary process diagram illustrating a battery charger test function performed by a battery monitoring application according to an embodiment of the present disclosure.

Referring generally to FIG. 16, according to an embodiment of the present disclosure, an application may be configured to cause a device to execute the steps of process flow 800 to automatically generate and display the above-described charging status screen(s) upon a determination that a charging operation is taking place. The application receives 810 measured battery and/or environmental data from a battery monitoring device and displays 820 this data as provided in the previous embodiments. The application continuously or periodically monitors 830 the received battery voltage data. If the application detects 840 a drop in battery voltage (e.g. resulting from an applied load of a starter motor) followed by a rise of battery voltage (e.g. resulting from an alternator charging the battery) within a predetermined time interval (e.g. a few seconds), a determination may be made that the battery is being charged. Upon this determination, the application may automatically launch or display 850 the charging function screens shown above with respect to FIGS. 15A-15C. Otherwise, the application will continue to monitor 860 the battery.

The battery status and battery life estimation functions according to embodiments of the present disclosure may be performed by the above-described application running on a remote computing device (e.g. the cellular phone of the user), or may be performed by a functionally-similar application running on a processor of the battery monitor and the results of the operations (e.g. battery life estimation data) transmitted to the user's device. In still other embodiments, processing functionality such as determination of estimated battery life may be performed by one or more remote processing systems, such as cloud-based processing systems or remote servers in communication with one or more user devices. Data from a battery monitor may be provided to a remote processing system, in accordance with instructions of an application being executed by a processor of a remote device. Results of calculations, such as estimated battery life determinations, warnings and other data may be transmitted from a cloud-based processing system or other remote system to the user device, and particularly to an application executed by a processor of the user device, and displayed or otherwise output to the user in accordance with instructions of the application. In embodiments, a single user may have an application stored and capable of executing on multiple devices, any one of which will provide displays or other notifications of battery state and warnings, based on information from a remote processing system. Thus, the user may receive warnings of such parameters as voltage below a threshold, or estimated battery life below a threshold, and other data, at any device of the user. Similarly, devices of multiple users may be configured to output warnings and other data of the same battery; for example, devices of multiple relatives of an individual using a device such as a powered wheelchair or CPAP machine may have the same access to battery health data and warnings. In other embodiments, warnings may be provided via SMS message, cellular telephone call with predetermined or generated voice content, in addition to or in place of warnings generated by an application on the user device.

In embodiments, the battery monitor of the present disclosure may be embodied in a plurality of different configurations that each include a voltage testing circuit configured for a particular voltage range to provide different configurations and ranges of voltage discrimination suitable for different battery types, models and applications. Similarly, embodiments of the battery monitor may include different monitors that include different impedance testing circuits (e.g. variable frequency oscillator-based circuits) configured for different types or classes of battery.

It should be understood that embodiments of the present disclosure provide numerous advantages. For example, critical battery systems may be more accurately monitored for ensuring battery replacement occurs in a timely manner. Moreover, these systems may be used to more quickly and efficiently identify malfunctions and/or failures of battery-dependent systems and thus, expedite their repair. Further still, systems provide the ability for, by way of example only, family members to remotely monitor battery-dependent healthcare systems of their loved ones, ensuring system functionality and therefore incident prevention.

Embodiments of the present disclosure may further include a battery preservation function. By way of non-limiting example, using one or more of measured battery voltage, temperature, estimated remaining battery life, and determined battery charging function, embodiments of the preset disclosure may be configured to reduce a load placed on the battery (e.g. reduce the current drawn from the battery). More specifically, in one exemplary embodiment, a battery monitor (e.g. battery monitor 12 as described above) may interface with one or more control systems of a device associated with the battery being monitored (i.e. a device drawing current from the battery), for example, a control system of an electric vehicle. The battery monitoring device may be pre-programmed with instructions, or responsive to instructions received from one or more remote devices, for commanding a control system of the device to reduce the power consumed thereby. This may include, by way of non-limiting example only, reducing a maximum obtainable speed of a battery-powered vehicle (e.g. by limiting the torque produced by an electric drive motor), and/or limiting or terminating function any or all non-critical systems of a battery powered device (e.g. terminating accessory systems of an automobile, such as the function of the radio or navigation system).

Embodiments of a battery preservation function set forth herein may be initiated automatically upon a determination that one or more threshold parameters has been met or exceeded (e.g. battery voltage below a predetermined threshold, inadequate charging function, estimated battery life below a predetermined threshold, rate of change of one or more battery parameters in excess of a threshold, etc.). Moreover, in embodiments, a battery preservation function may also be initiated manually, upon receipt of a command input by an authorized user. An application running on a user-accessible device may include processor-executable instructions that provide a user an option to initiate a battery preservation function, such as by an option accessible, via a selectable icon, by way of example, on an application home screen or via one or more menus. Such an option may be available at all times in embodiments. In other embodiments, the application may include instructions that cause a processor to provide an alert including a user-selectable option to provide a command to initiate a battery preservation function, upon determination that the one or more threshold parameters has been met or exceeded. For example, individuals remotely monitoring one or more battery-dependent systems may be provided the ability to initiate a battery preservation function in order to preserve or extend the life of one or more systems relying on battery power (e.g. extend the life of a piece of healthcare equipment), until repair or replacement of a battery or associate component can be realized.

It should be understood that the battery preservation functions described herein may be implemented in any number of ways. In one embodiment, one or more control systems of a device relying on battery power may be pre-programmed or otherwise pre-configured to receive instructions for reducing the load applied to the battery. For example, the control system may include a wireless antenna and associated circuits for receiving a signal with instructions to implement a battery preservation function wirelessly from a user device or a battery monitor. In other embodiments, a battery preservation function may be retrofitted to existing systems. In these embodiments one or more battery-dependent systems may be selectively activated, deactivated, or otherwise limited. This may be achieved, by way of non-limiting example only, by selectively placing switching elements along relevant electrical connections to one or more battery-dependent systems. The switching elements may be responsive to one or more control signals generated by a battery monitor (or remote device) for selective activation or deactivation thereof.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A system for monitoring battery status and estimating battery life comprising:
   a battery monitor configured to connect to a battery including:
      a voltage detection circuit;
      a temperature sensor; and
      a wireless transmitter configured to transmit voltage and temperature data measured by the voltage detection circuit and the temperature sensor; and
   a remote device comprising one or more computer processors and a memory in communication with the one or more processors and storing program instructions, the one or more computer processors operative with the program instructions to:
   receive battery voltage and temperature data from the battery monitor;
   receive data related to a geographic location of the battery;
   receive a predetermined rated life of the battery;
   associate the received geographic location of the battery with an environmental condition;
   associate the environmental condition with a stress factor;
   generate a real-time indication of battery voltage; and
   using the received battery voltage and temperature data and applying the stress factor to the predetermined rated battery life, generate predicted battery life data.

2. The system of claim 1, wherein the one or more processors of the remote device are further operative with the program instructions to transmit the predicted battery life data to a second remote device.

3. The system of claim 1, wherein the one or more processors of the remote device are further operative with the program instructions to transmit at least one of the received battery voltage and temperature data to a second remote device.

4. The system of claim 1, wherein the one or more processors of the remote device are further operative with the program instructions to:
   determine from the received battery voltage data indicative of a charging state of the battery; and
   generate a real-time indication of the charging state of the battery.

5. The system of claim 4, wherein the one or more processors of the remote device are further operative with the program instructions to transmit the data indicative of the charging state of the battery to a second remote device.

6. The system of claim 1, wherein the remote device comprises a mobile telephone.

7. A system for monitoring battery status and estimating battery life comprising:
   a battery monitor configured to connect to a battery including:
      a voltage detection circuit;
      a temperature sensor; and
      a wireless transmitter configured to transmit voltage and temperature data measured by the voltage detection circuit and the temperature sensor; and
   a remote device comprising one or more computer processors and a memory in communication with the one or more processors and storing program instructions, the one or more computer processors operative with the program instructions to:
   receive battery voltage and temperature data from the battery monitor;
   receive data related to a geographic location of the battery;
   receive a predetermined rated life of the battery;
   associate the received geographic location of the battery with an environmental condition;
   associate the environmental condition with a stress factor;
   receive and store data indicative of a date of first use of the battery;
   generate a real-time indication of battery voltage; and
   using the received battery voltage, temperature data, and data indicative of the date of first use of the battery, and applying the stress factor to the predetermined rated battery life, generate predicted battery life data.

8. A method for monitoring the status of a battery and estimating the life of the battery comprising:
   measuring the battery voltage;
   measuring a temperature associated with the battery;
   transmitting the measured voltage and temperature to a first remote computing device;
   receiving with the first remote computing device the measured battery voltage and temperature;
   receiving data related to a geographic location of the battery;
   receiving a predetermined rated life of the battery;
   identifying a battery stress factor associated with the geographic location of the battery;
   applying the stress factor to the predetermined rated battery life in order to generate the estimate of remaining battery life;
   generating a real-time indication of the measured battery voltage; and
   generating and displaying, using the received measured battery voltage and temperature and applying the stress factor to the predetermined rated battery life, an estimate of remaining battery life including an estimated number of cycles remaining.

9. The method of claim 8, further comprising the step of transmitting the estimate of remaining battery life to a second remote computing device.

10. The method of claim 9, wherein the estimate of remaining battery life is transmitted via a mobile telephone network.

11. The method of claim 8, further comprising the step of transmitting at least one of the received measured battery voltage and temperature data to a second remote computing device.

12. The method of claim 8, further comprising the steps of:
- determining from the received battery voltage data indicative of a charging state of the battery; and
- generating a real-time indication of the charging state of the battery.

13. The method of claim 12, further comprising the step of transmitting the data indicative of the charging state of the battery to a second remote computing device.

14. The method of claim 8, further comprising the steps of receiving and storing data indicative of a date of first use of the battery,
- wherein the estimated remaining battery life is generated using the received measured battery voltage and temperature data, and the data indicative of the date of first use of the battery.

\* \* \* \* \*